US010727817B2

(12) United States Patent
Kamiyama (10) Patent No.: US 10,727,817 B2
(45) Date of Patent: Jul. 28, 2020

(54) REAL-TIME CLOCK DEVICE, ELECTRONIC DEVICE, AND VEHICLE

(71) Applicant: SEIKO EPSON CORPORATION, Tokyo (JP)

(72) Inventor: Masayuki Kamiyama, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/597,926

(22) Filed: Oct. 10, 2019

(65) Prior Publication Data

US 2020/0119722 A1 Apr. 16, 2020

(30) Foreign Application Priority Data

Oct. 11, 2018 (JP) ................... 2018-192340

(51) Int. Cl.
*H03K 3/00* (2006.01)
*H03K 3/0231* (2006.01)
*G06F 1/14* (2006.01)
*H03B 5/36* (2006.01)

(52) U.S. Cl.
CPC ............. *H03K 3/0231* (2013.01); *G06F 1/14* (2013.01); *H03B 5/36* (2013.01); *H03B 2200/008* (2013.01)

(58) Field of Classification Search
CPC .......... H03K 3/0231; G06F 1/14; H03B 5/36; H03B 2200/008
USPC ........................................................ 327/291
See application file for complete search history.

(56) References Cited

U.S. PATENT DOCUMENTS

| 9,438,073 | B2 * | 9/2016 | Kamiyama | H02J 9/06 |
| 10,128,854 | B2 * | 11/2018 | Shirotori | H03L 1/04 |
| 10,135,391 | B2 * | 11/2018 | Shirotori | H03B 5/32 |
| 10,379,571 | B2 * | 8/2019 | Kamiyama | G06F 1/14 |
| 2007/0266263 | A1 * | 11/2007 | Lee | G06F 1/3203 |
| | | | | 713/300 |
| 2010/0303195 | A1 * | 12/2010 | Wang | G09G 3/3674 |
| | | | | 377/64 |
| 2011/0234417 | A1 * | 9/2011 | Aleman | G06F 1/14 |
| | | | | 340/660 |
| 2016/0328637 | A1 * | 11/2016 | Viikari | H04Q 9/00 |
| 2017/0034867 | A1 | 2/2017 | Oshida | |
| 2017/0194966 | A1 * | 7/2017 | Yonezawa | H03B 5/362 |
| 2017/0286820 | A1 * | 10/2017 | Nikunen | H04Q 9/00 |
| 2018/0210488 | A1 * | 7/2018 | Kiya | G07C 5/00 |
| 2018/0212593 | A1 * | 7/2018 | Usuda | H03K 5/26 |
| 2018/0212609 | A1 * | 7/2018 | Usuda | H03L 1/028 |

(Continued)

FOREIGN PATENT DOCUMENTS

| JP | 2017-028654 A | 2/2017 |
| JP | 2018-116587 A | 7/2018 |

*Primary Examiner* — Ryan Jager
(74) *Attorney, Agent, or Firm* — Oliff PLC (57) ABSTRACT

A real-time clock device includes an oscillation circuit configured to generate an oscillation signal using a resonator, a clocking circuit configured to generate present time data based on the oscillation signal, an interface circuit configured to receive a time rewriting request and time rewriting data for the present time data from an external device, and a control circuit configured to perform comparison processing of the present time data of the clocking circuit and the time rewriting data to determine whether the time rewriting data is legitimate.

17 Claims, 7 Drawing Sheets

(56) References Cited

U.S. PATENT DOCUMENTS

2018/0212786 A1* 7/2018 Kamiyama .............. G09C 1/00
2018/0356855 A1* 12/2018 Kamiyama .............. G04C 9/00

* cited by examiner

REAL-TIME CLOCK DEVICE, ELECTRONIC DEVICE, AND VEHICLE

The present application is based on, and claims priority from JP Application Serial Number 2018-192340, filed Oct. 11, 2018, the disclosure of which is hereby incorporated by reference herein in its entirety.

BACKGROUND

1. Technical Field

The present disclosure relates to a real-time clock device, an electronic device, a vehicle, and the like.

2. Related Art

In various systems, there is known a method of performing clocking using a counter or the like and using data of the clocking as present time data of a system. The system acquires time data from a network, a satellite positioning system, or the like and rewrites the clocking data of the counter with the time data. This enables initialization of the clocking data, periodical correction of the clocking data, or the like. At this time, when the clocking data is rewritten by illegitimate time data, the present time of the system changes to illegitimate time.

A method of verifying legitimacy of time data acquired from a system outside is disclosed in, for example, JP A-2017-28654 (Patent Literature 1). In Patent Literature 1, before an MPU enters a sleep mode, the MPU generates timestamp data based on internal time information and causes a nonvolatile memory in the MPU to store the timestamp data. When the MPU is turned on again, the MPU compares the timestamp data read out from the nonvolatile memory and external time information acquired anew to verify legitimacy of the external time information. When the external time information is time information more in the past than the timestamp data, the MPU determines that the external time information is illegitimate.

When the present time data of the system is rewritten by time data acquired from the outside, it is desired to more accurately verify legitimacy of the time data. In the method of Patent Literature 1, illegitimate external data that can be surely rejected is limited to time data more in the past than the timestamp data stored in the nonvolatile memory. For example, when external time data is time from when the MPU enters the sleep mode until when the MPU is turned on again, the external time data cannot be rejected.

SUMMARY

An advantage of some aspects of the present disclosure is to solve at least the problems described above, and the present disclosure can be realized as the following forms or aspects.

An aspect of the present disclosure relates to a real-time clock device including: an oscillation circuit configured to generate an oscillation signal using a resonator; a clocking circuit configured to generate present time data based on the oscillation signal; an interface circuit configured to receive a time rewriting request and time rewriting data for the present time data from an external device; and a control circuit configured to perform comparison processing of the present time data of the clocking circuit and the time rewriting data to determine whether the time rewriting data is legitimate.

DESCRIPTION OF EXEMPLARY EMBODIMENTS

A preferred embodiment of the present disclosure is explained in detail below. The embodiment explained below does not unduly limit the content of the present disclosure described in the appended claims. Not all of components explained in the embodiment are essential as solutions of the present disclosure.

1. System Example

Figure 1:
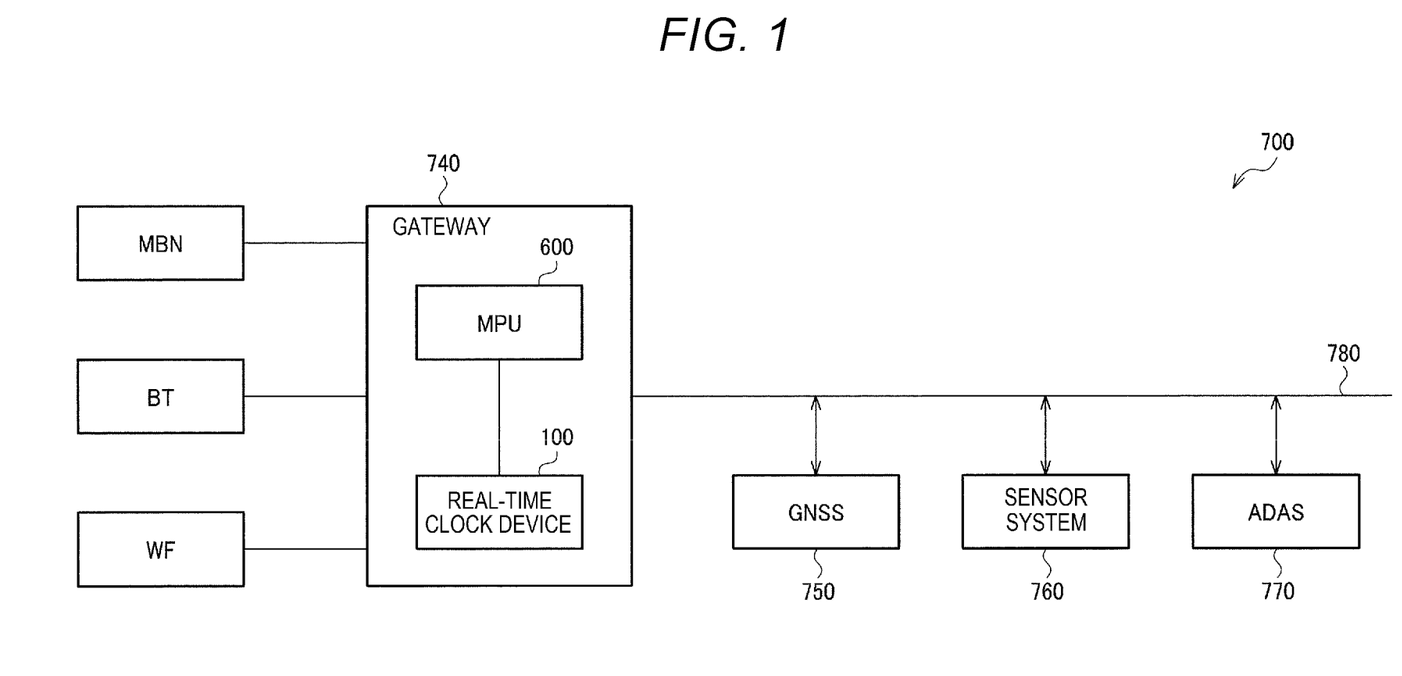
FIG. 1 is an example of a system including a real-time clock device in an embodiment.

FIG. 1 is an example of a system including a real-time clock device 100 in this embodiment. In FIG. 1, a vehicle-mounted network system 700 is shown as an example of the system. The vehicle-mounted network system 700 includes a gateway 740 for coupling a vehicle-mounted network and an external network and a bus 780 for the vehicle-mounted network coupled to the gateway 740. The vehicle-mounted network system 700 can include, for example, communication circuits MBN, BT, and WF, a GNSS (Global Navigation Satellite System) 750, a sensor system 760, and an ADAS 770 (Advanced Driver Assistance Systems).

The communication circuits MBN, BT, and WF are circuits for performing communication between the vehicle-mounted network system 700 and an external network and are coupled to the gateway 740. For example, the communication circuit MBN performs wireless communication between the vehicle-mounted network system 700 and a mobile network such as an LTE (Long Term Evolution). The communication circuit BT performs wireless communication in a proximity communication standard such as Bluetooth (registered trademark). The communication circuit WF performs wireless communication in a wireless LAN communication standard such as Wi-Fi (registered trademark).

The bus 780 is a bus of a vehicle-mounted network standard such as a CAN (Controller Area Network). The GNSS 750, the sensor system 760, and the ADAS 770 are coupled to the gateway 740 via the bus 780. The GNSS 750 is a positioning system such as a GPS (Global Positioning System). The sensor system 760 is an imaging sensor such as an LIDAR (Laser Imaging Detection And Ranging), a range finding sensor, or the like. The ADAS 770 performs operation supporting control based on information received from the GNSS 750 and the sensor system 760.

The gateway 740 includes an MPU 600 and the real-time clock device 100. In the following explanation, the MPU 600 is referred to as an external device as opposed to the real-time clock device 100.

The MPU 600 performs processing for connecting the vehicle-mounted network and the external network. The MPU 600 performs synchronous processing of time in the vehicle-mounted network system 700. Specifically, the MPU 600 acquires time data from the communication circuits MBN, BT, and WF, the GNSS 750, or the like and rewrites present time data of the real-time clock device 100 based on the time data. At the same time, the MPU 600 broadcasts the updated present time data of the real-time clock device 100 to the vehicle-mounted network. As a result, local time data retained by the GNSS 750, the sensor system 760, and the ADAS 770 in the vehicle-mounted network is updated by the present time data received from the gateway 740.

Time of the vehicle-mounted network system 700 is used for, for example, reliability determination of information received by the vehicle-mounted network system 700. That is, the vehicle-mounted network system 700 can determine, by comparing a timestamp of the received information and time retained by the vehicle-mounted network system 700, whether the received information can be trusted.

However, it is likely that the communication circuits MBN, BT, and WF, the GNSS 750, or the like is illegitimately accessed and information including time data different from true time is input to the vehicle-mounted network system 700. In this case, time rewriting data for the MPU 600 to rewrite the present time data of the real-time clock device 100 changes to illegitimate data. If the real-time clock device 100 allows rewriting of the present time data by the time rewriting data, time of the entire vehicle-mounted network system 700 is likely to be set to illegitimate time. Then, it is likely that the vehicle-mounted network system 700 cannot properly perform the reliability determination of the received information. For example, there is known a method called replay attack for recording information communicated in the past in inter-vehicle communication and reproducing and transmitting the recorded information. If the time of the vehicle-mounted network system 700 is set to time more in the past than the true time, even if the vehicle-mounted network system 700 receives the replay attack, the vehicle-mounted network system 700 cannot detect that time data received by the replay attack is illegitimate.

2. First Configuration Example

Figure 2:
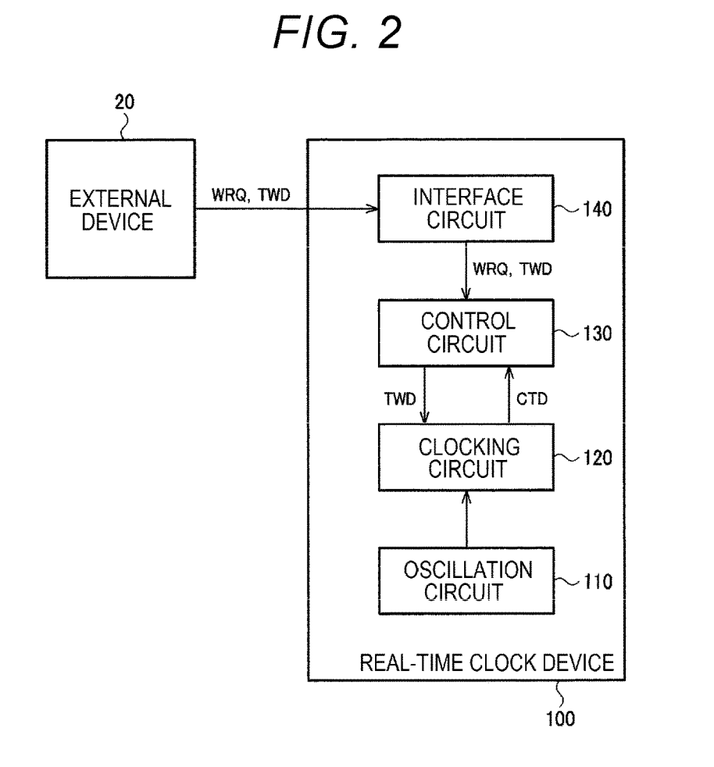
FIG. 2 is a first configuration example of the real-time clock in the embodiment.

FIG. 2 is a first configuration example of the real-time clock device 100 in this embodiment. The real-time clock device 100 includes an interface circuit 140, a control circuit 130, a clocking circuit 120, and an oscillation circuit 110.

The real-time clock device 100 is configured by a circuit device such as an integrated circuit device. The circuit device includes the interface circuit 140, the control circuit 130, the clocking circuit 120, and the oscillation circuit 110. Alternatively, a real-time clock device may include the circuit device and a resonator electrically coupled to the oscillation circuit 110. For example, a real-time clock device may be configured by housing the circuit device and the resonator in a package. The electric coupling means coupling capable of transmitting an electric signal. Coupling capable of transmitting information with an electric signal is the electric coupling. The electric coupling may be coupling via a signal line, an active element, or the like.

The oscillation circuit 110 generates an oscillation signal using the resonator. The clocking circuit 120 generates present time data CTD based on the oscillation signal. That is, the oscillation circuit 110 buffers or divides the oscillation signal to output a clock signal. The clocking circuit 120 divides the clock signal output from the oscillation circuit 110, generates a clock signal of a one-second cycle, and counts the clock signal of the one-second cycle to measure a time. A count value of a counter of the clocking circuit 120 corresponds to the present time data CTD.

The present time data is data measured as real-time clock information indicating present time. For example, clocking data is data indicating date and time and can include calendar data and time data. For example, the calendar data is data such as year, month, week, and day. The time data is data such as hour, minute, and second.

The interface circuit 140 receives a time rewriting request WRQ and time rewriting data TWD for the present time data CTD from an external device 20. The external device 20 is a processing device such as an SOC (System On Chip), a CPU, or an MPU. For example, in FIG. 1, the external device 20 is the MPU 600. The control circuit 130 performs comparison processing of the present time data CTD of the clocking circuit 120 and the time rewriting data TWD to determine whether the time rewriting data TWD is legitimate. Specifically, the control circuit 130 determines whether a difference between the present time data CTD and the time rewriting data TWD is smaller than an allowable error. When the difference is smaller than the allowable error, the control circuit 130 determines that the time rewriting data TWD is legitimate. When the difference is equal to or larger than the allowable error, the control circuit 130 determines that the time rewriting data TWD is illegitimate.

The time rewriting request WRQ is a command or a control signal with which the external device 20 instructs the real-time clock device 100 to rewrite the present time data. The time rewriting data TWD is time data for the external device 20 to rewrite the present time data CTD clocked by the counter of the clocking circuit 120. For example, in FIG. 1, the MPU 600 outputs time data acquired from the communication circuit MBN, BT, and WF or the GNSS 750 to the real-time-clock device 100 as the time rewriting data TWD.

When receiving the time rewriting request WRQ and the time rewriting data TWD from the external device 20 via the interface circuit 140, the control circuit 130 of the real-time clock device 100 reads out the present time data CTD from the clocking circuit 120 and executes comparison processing of the read-out present time data CTD and the time rewriting data TWD received from the external device 20.

The allowable error is a time error allowed in determining legitimacy of the time rewriting data TWD. For example, the allowable error is calculated using reference time data and clocking accuracy data as explained below. In this case, the allowable error is calculated every time the comparison processing is executed. The allowable error is not fixed. Alternatively, the allowable error may be a fixed value rather than a value calculated by an arithmetic operation. In this case, the allowable error may be the same in a plurality of times of the comparison processing.

According to this embodiment, the comparison processing of the present time data CTD and the time rewriting data TWD is performed to determine whether the time rewriting data TWD is legitimate. That is, it is possible to accurately determine legitimacy of the time rewriting data TWD because the determination is performed based on time data indicating present time rather than based on time data indicating time in the past. Consequently, for example, in the system shown in FIG. 1, the gateway 740 can broadcast legitimate time data to the vehicle-mounted network.

For example, in Patent Literature 1 described above, legitimacy of the time data acquired after the MPU is turned on again is determined based on the time data at the time when the MPU sleeps. However, since clocking is not performed while the MPU sleeps, a time elapses from when the MPU sleeps until the MPU is turned on again is unknown. Therefore, determination accuracy of legitimacy is likely to be deteriorated. In this regard, according to this embodiment, the real-time clock device 100 provided separately from the MPU performs clocking. The present time data CTD of the real-time clock device 100 and the time rewriting data TWD is performed. Consequently, it is possible to perform highly accurate legitimacy determination based on the present time data CTD.

In Patent Literature 1 described above, a hardware configuration and a sequence for mounting a nonvolatile memory in the MPU and emergently retracting timestamp data to the nonvolatile memory at sudden power-off time are necessary. In this regard, according to this embodiment, since the real-time clock device 100 provided separately from the MPU performs the clocking, a hardware configuration and a sequence for emergently retracting timestamp data to the nonvolatile memory at sudden power-off time are unnecessary.

The control circuit 130 performs the following processing after performing the comparison processing of the present time data CTD and the time rewriting data TWD. That is, when determining in the comparison processing that the time rewriting data TWD is legitimate, the control circuit 130 permits the time rewriting request WRQ and executes the time rewriting request WRQ. Specifically, when determining that the time rewriting data TWD is legitimate, the control circuit 130 outputs a writing signal and the time rewriting data TWD to the clocking circuit 120. The clocking circuit 120 rewrites the present time data CTD clocked by the counter with the time rewriting data TWD using the writing signal output from the control circuit 130. The clocking circuit 120 starts the clocking again from the time rewriting data TWD and outputs clocking data of the clocking as the present time data CTD.

According to this embodiment, when it is determined that the time rewriting data TWD received from the external device 20 is illegitimate, the present time data CTD of the clocking circuit 120 is not rewritten by the time rewriting data TWD. In other words, when it is determined that the time rewriting data TWD from the external device 20 is illegitimate, the control circuit 130 does not output the writing signal and the time rewriting data TWD to the clocking circuit 120. Consequently, it is possible to prevent the present time data CTD of the real-time clock device 100 from being rewritten by the illegitimate time rewriting data TWD.

Processing performed by the control circuit 130 after the comparison processing is not limited to the above. For example, the control circuit 130 may rewrite the present time data CTD with the time rewriting data TWD and notify a determination result about whether the time rewriting data TWD is legitimate to the external device 20 via the interface circuit 140.

Consequently, even when the present time data CTD of the real-time clock device 100 is rewritten by the illegitimate time rewriting data TWD, the external device 20 can take measures against the illegitimate rewriting. For example, when receiving, from the real-time clock device 100, a determination result that the time rewriting data TWD is illegitimate, the external device 20 does not adopt the present time data CTD of the real-time clock device 100. For example, in FIG. 1, the MPU 600 does not broadcast the present time data CTD of the real-time clock device 100 to the vehicle-mounted network. Alternatively, when receiving, from the real-time clock device 100, the determination result that the time rewriting data TWD is illegitimate, the external device 20 may transmit the time rewriting request WRQ and the time rewriting data TWD to the real-time clock device 100. For example, in FIG. 1, the MPU 600 may acquire time data anew from the communication circuits MBN, BT, and WF or the GNSS 750 and transmit the time data to the real-time clock device 100 as the time rewriting data TWD.

In this embodiment, even when the external device 20 is turned off, the real-time clock device 100 is on and continues the clocking. Details are explained below.

Figure 3:
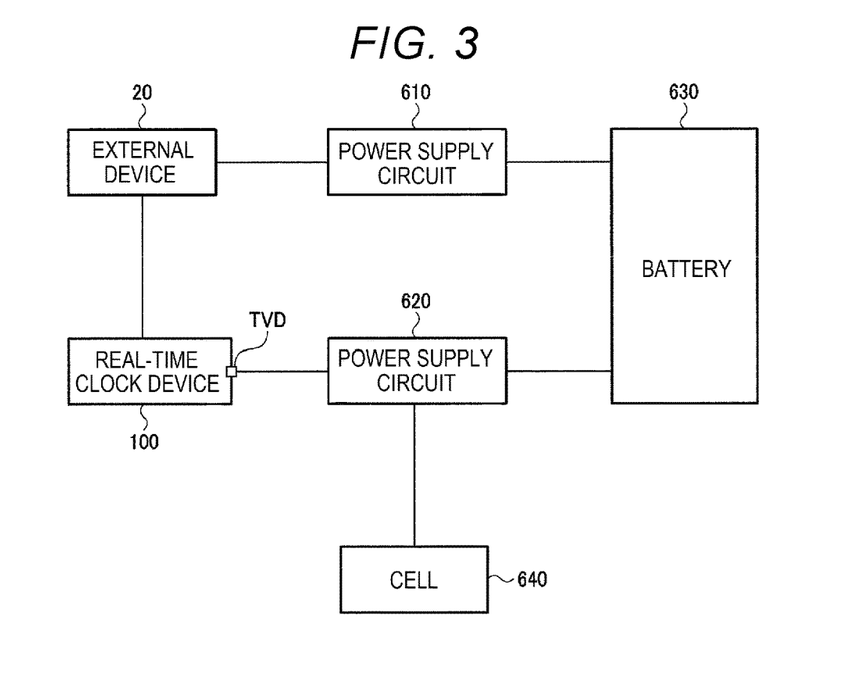
FIG. 3 is an example of a power supply system that supplies electric power to the real-time clock in the embodiment.

An example of a power supply system that supplies electric power to the external device 20 and the real-time clock device 100 is shown in FIG. 3. For example, the power supply system is mounted on an automobile together with the vehicle-mounted network system 700 shown in FIG. 1. Alternatively, the power supply system may be mounted on various electronic devices together with the external device 20 and the real-time clock device 100.

As shown in FIG. 3, first electric power is supplied to the external device 20 from a power supply circuit 610. The power supply circuit 610 supplies the first electric power based on electric power supplied from a battery 630. The real-time clock device 100 includes a power supply terminal TVD. Second electric power is supplied to the power supply terminal TVD from a power supply circuit 620. The power supply circuit 620 supplies the second electric power based on the electric power supplied from the battery 630. The real-time clock device 100 performs a clocking operation with the second electric power supplied to the power supply terminal TVD.

At this time, even when the power supply circuit 610 turns off the first electric power to the external device 20, the power supply circuit 620 maintains the second electric power to the real-time clock device 100 on. That is, although the external device 20 is turned on and off according to ON and OFF of the first electric power, the real-time clock device 100 is maintained on by the second electric power. For example, in an automobile, the power supply circuit 610 controls the first electric power to on or off while being linked with an ignition key. On the other hand, the power supply circuit 620 is not linked with the ignition key and always maintains the second electric power on. For example, a cell 640 or a not-shown electric double layer capacitor may be amounted. When the battery 630 is removed, the power supply circuit 620 may supply the second electric power to the real-time clock device 100 based on electric power from the cell 640 or the electric double layer capacitor.

According to this embodiment, even when the first electric power supplied to the external device 20 is off, the second electric power supplied to the real-time clock device 100 is on. Consequently, it is possible to perform the comparison processing of the present time data CTD and the time rewriting data TWD. For example, time data is acquired from a system outside during the start of the system. The present time data of the real-time clock device 100 is rewritten using the time data as rewriting time data. At this time, the rea-time clock device 100 continues the clocking even while the power supply of the system is shut down. Therefore, the present time data is present even during the start of the system. Consequently, it is possible to perform the comparison processing of the present time data CTD and the time rewriting data TWD even during the start of the system.

3. First Detailed Configuration Example

Figure 4:
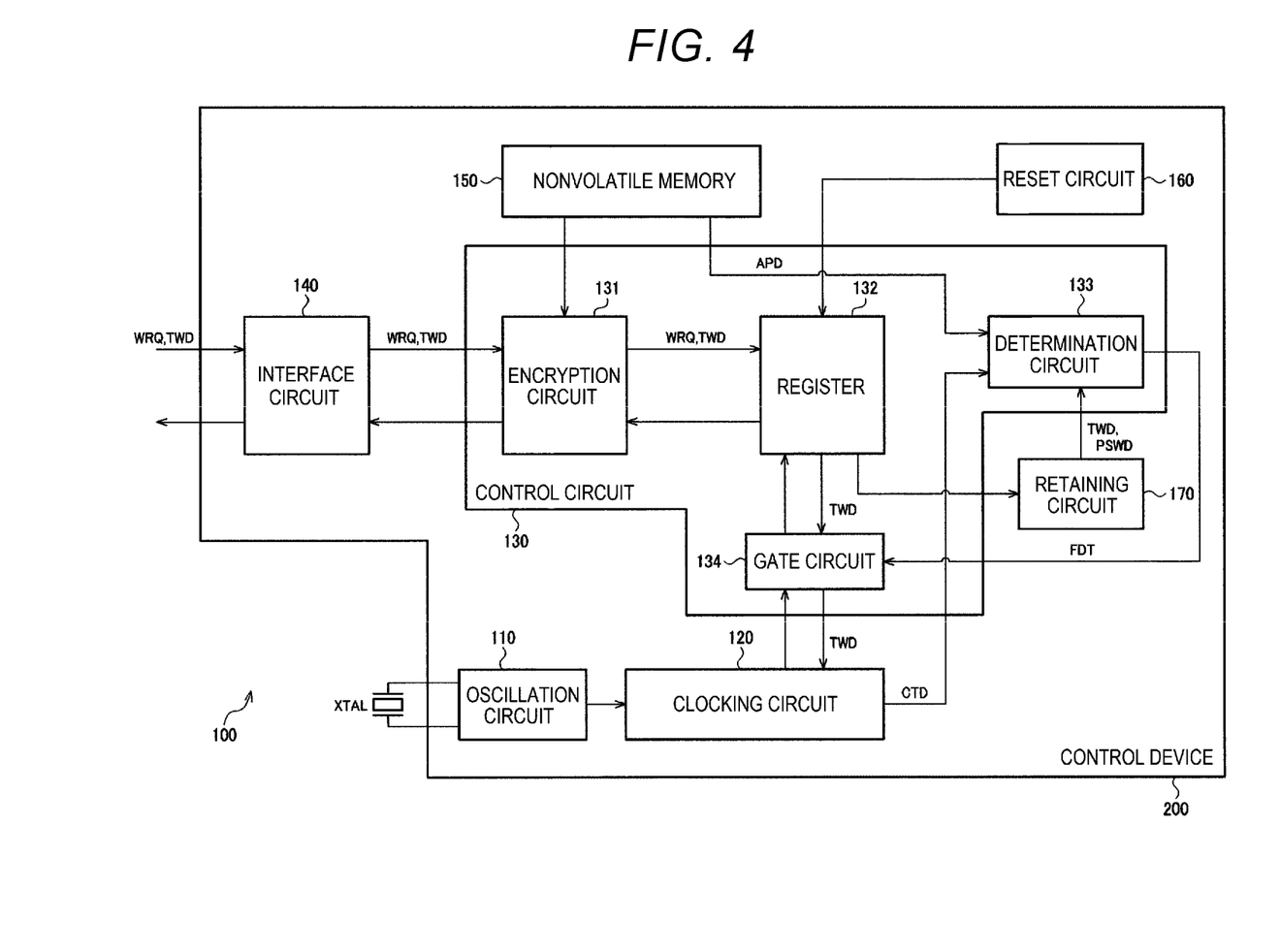
FIG. 4 is a first detailed configuration example of the real-time clock device.

FIG. 4 is a first detailed configuration example of the real-time clock device 100. The real-time clock device 100 includes a circuit device 200 and a resonator XTAL. The circuit device 200 is, for example, an integrated circuit device. The circuit device 200 includes the oscillation circuit 110, the clocking circuit 120, the control circuit 130, the interface circuit 140, a nonvolatile memory 150, a reset circuit 160, and a retaining circuit 170. The same components as the components explained above are denoted by the same reference numerals and signs. Explanation about the components is omitted as appropriate.

The resonator XTAL is, for example, a piezoelectric resonator. The piezoelectric resonator is, for example, a crystal resonator. The crystal resonator is, for example, a tuning fork-type crystal resonator or a crystal resonator that performs thickness-shear vibration, a cut angle of the crystal resonator being AT cut, SC cut, or the like. As the resonator, an SAW (Surface Acoustic Wave) resonator, an MEMS (Micro Electro Mechanical Systems) resonator functioning as a silicon resonator formed using a silicon substrate, or the like may be adopted.

The reset circuit 160 performs reset processing of the circuit device 200. Specifically, the reset circuit 160 is a power-on reset circuit. The reset circuit 160 generates a reset pulse when the circuit device 200 is turned on. The control circuit 130 is brought into a reset state by the reset pulse and thereafter changes to a reset release state.

The interface circuit 140 performs communication between the external device 20 and the real-time clock device 100. As a communication system of the interface circuit 140, for example, an I2C (Inter Integrated Circuit) system, an SPI (Serial Peripheral Interface) system, or the like can be adopted. The interface circuit 140 can include an input/output buffer circuit, a control logic circuit, and the like that realize these communication systems.

The nonvolatile memory 150 is a memory that stores clocking accuracy data APD of the clocking circuit 120. The clocking accuracy data APD is data representing clocking accuracy with respect to true elapsing of time and is, for example, data representing a time error per unit time. Specifically, the clocking accuracy data APD is data representing oscillation frequency accuracy of the resonator XTAL. That is, the clocking accuracy data APD is data indicating a deviation of an oscillation frequency per unit time due to oscillation frequency characteristics of the resonator XTAL and the oscillation circuit 110. The clocking accuracy data APD is a measurement result during manufacturing or the like of the real-time clock device 100, a design value, or the like and is stored in the nonvolatile memory 150 in advance.

The nonvolatile memory 150 is, for example, an EEPROM (Electrically Erasable Programmable Read Only Memory) or a flash memory. The EEPROM can be realized by, for example, a floating gate-type memory cell. The flash memory can be realized by, for example, a memory cell of an MONOS (Metal Oxide Nitride Oxide Silicon). Alternatively, the nonvolatile memory 150 may be a memory including a fuse cell.

In the memory of this type, the fuse cell, which is the memory cell, includes a resistance element and a selector element coupled to the resistance element in series. The selector element is, for example, a diode of PN junction or an MOS transistor. For example, one end of the resistance element is coupled to a bit line and the other end of the resistance element is coupled to an anode of the diode. A cathode of the diode is coupled to a word line. The resistance element functioning as a fuse element is a programmable resistor having a variable resistance value. Data is stored in the fuse cell by the variable resistance value.

The retaining circuit 170 retains reference time data PSWD. The reference time data PSWD is time data serving as an indicator of time when the present time data CTD is rewritten last time. Specifically, the reference time data PSWD is time data at the time when the present time data CTD of the clocking circuit 120 is rewritten last time or time data substituting the time data. By using the reference time data PSWD, it is possible to learn an elapsed time from when the present time data CTD of the clocking circuit 120 is rewritten last time until the present.

For example, the retaining circuit 170 retains, as the reference time data PSWD, the time rewriting data TWD input from the external device 20 in the last time rewriting. That is, the control circuit 130 receives the time rewriting data TWD from the external device 20 via the interface circuit 140 and outputs the time rewriting data TWD to the retaining circuit 170. The retaining circuit 170 retains the time rewriting data TWD. The time rewriting data TWD is represented as time rewriting data TWD1. Similarly, when the control circuit 130 receives the time rewriting data TWD anew and outputs the time rewriting data TWD to the retaining circuit 170, the retaining circuit 170 retains time rewriting data TWD2 anew. At this time, the retaining circuit 170 retains the time rewriting data TWD1 of the last time as the reference time data PSWD. Alternatively, the retaining circuit 170 may retain, as the reference time data PSWD, the present time data CTD at the time when the external device 20 is shut down. That is, the external device 20 outputs an event signal when being shut down. When receiving the event signal via the interface circuit 140, the control circuit 130 reads out the present time data CTD from the clocking circuit 120 and outputs the present time data CTD to the retaining circuit 170. The retaining circuit 170 retains the present time data CTD as the reference time data PSWD. The retaining circuit 170 is a semiconductor memory such as an SRAM or a DRAM. Alternatively, the retaining circuit 170 may be a register configured by a flip-flop circuit and the like.

The control circuit 130 includes an encryption circuit 131, a register 132, a determination circuit 133, and a gate circuit 134. The control circuit 130 is a logic circuit and is, for example, a gate array circuit configured by automatic layout wiring. The control circuit 130 and the clocking circuit 120 may be configured as an integral gate array circuit or the like.

The encryption circuit 131 performs decryption processing of encrypted data received via the interface circuit 140. The encryption circuit 131 performs encryption processing of data transmitted via the interface circuit 140. As an encryption system, for example, a common key encryption system such as an AES (Advanced Encryption Standard) or a public key encryption system such as an RSA can be used. The interface circuit 140 receives an encrypted time rewriting request WRQ and encrypted time rewriting data TWD. The encryption circuit 131 performs decryption processing of the time rewriting request WRQ and the time rewriting data TWD. The register 132 stores the time rewriting request WRQ and the time rewriting data TWD subjected to the decryption processing. When the interface circuit 140 receives a readout request from the external device 20, the encryption circuit 131 outputs the encrypted present time data CTD to the external device 20 via the interface circuit 140.

The determination circuit 133 performs comparison processing using the reference time data PSWD, the clocking accuracy data APD, and the present time data CTD to determine whether the time rewriting data TWD is legitimate. That is, when the time rewriting request WRQ is written in the register 132, the determination circuit 133 reads out the reference time data PSWD and the time rewriting data TWD from the retaining circuit 170, reads out the clocking accuracy data APD from the nonvolatile memory 150, and reads out the present time data CTD from the clocking circuit 120. The determination circuit 133 performs comparison processing of the time rewriting data TWD and the present time data CTD using these data.

Specifically, as indicated by the following Expression (1), the determination circuit 133 calculates an allowable error TLR based on a difference between the present time data CTD and the reference time data PSWD and the clocking accuracy data APD and determines, based on the allowable error TLR, whether the time rewriting data TWD is legitimate.

$$TLR = (CTD - PSWD) \times APD \qquad (1)$$

An example of calculation of the allowable error TLR is explained. The clocking accuracy data APD includes a temperature characteristic, a reflow shift characteristic, and an aging characteristic. The temperature characteristic is an oscillation frequency deviation due to a temperature characteristic of an oscillation frequency of the resonator XTAL. As an example, the temperature characteristic is set to ±3.4 ppm/second. The reflow shift characteristic is an oscillation frequency deviation due to a voltage characteristic of the oscillation frequency. As an example, the reflow shift characteristic is set to ±3.0 ppm/second. The aging characteristic is an oscillation frequency deviation indicating a change with time of the oscillation frequency. As an example, the aging characteristic is set to ±5.0 ppm/year. CTD and PSWD are count values of the clocking circuit 120. One count represents one second. As an example, CTD=869000 counts and PSWD=5000 counts. CTD−PSWD=864000 counts is equivalent to 10 days. When the numerical values are substituted in the above Expression (1), the allowable error TLR is as indicated by the following Expression (2).

$$TLR = (8690005 - 50005) \times (3.4\ ppm + 3.0\ ppm + 5.0\ ppm/(365\ day \times 24\ h \times 60\ min \times 60\ s)) = 5.5265 \qquad (2)$$

When the following Expressions (3) and (4) are satisfied, the determination circuit 133 determines that the time rewriting data TWD is legitimate. That is, when a difference between the present time data CTD and the time rewriting data TWD is smaller than the allowable error TLR, the determination circuit 133 determines that the time rewriting data TWD is legitimate.

$$TWD > CTD - |TLR| \qquad (3)$$

$$TWD < CTD + |TLR| \qquad (4)$$

The determination circuit 133 outputs a determination signal FDT to the gate circuit 134 based on a result of the determination. When determining that the time rewriting data TWD is legitimate, the determination circuit 133 makes the determination signal FDT active. When determining that the time rewriting data TWD is illegitimate, the determination circuit 133 makes the determination signal FDT inactive. "Active" is a first logic level and "inactive" is a second logic level.

When the determination signal FDT is active, the gate circuit 134 permits rewriting of the present time data CTD by the time rewriting data TWD and executes the rewriting. That is, when the determination signal FDT is active, the gate circuit 134 outputs the time rewriting data TWD received from the register 132 to the clocking circuit 120 and outputs a writing signal to the clocking circuit 120. The clocking circuit 120 rewrites the present time data CTD with the time rewriting data TWD based on the writing signal.

According to this embodiment, the determination circuit 133 can estimate a maximum error of the present time data CTD by calculating the allowable error TLR using the reference time data PSWD and the clocking accuracy data APD. The determination circuit 133 can determine the time rewriting data TWD having an error equal to or larger than the allowable error TLR as illegitimate data by performing the comparison processing of the time rewriting data TWD and the present time data CTD using the allowable error TLR. Consequently, a range for determining whether the time rewriting data TWD is illegitimate is limited. Therefore, accuracy of verification of legitimacy of the time rewriting data TWD increases.

According to this embodiment, the nonvolatile memory 150 is capable of storing the clocking accuracy data APD for each individual of the real-time clock device 100. Consequently, the determination circuit 133 can estimate a maximum error of the present time data CTD for each individual. Therefore, the accuracy of verification of legitimacy of the time rewriting data TWD further increases.

4. Time Rewriting Processing Flow of the System

Figure 5:
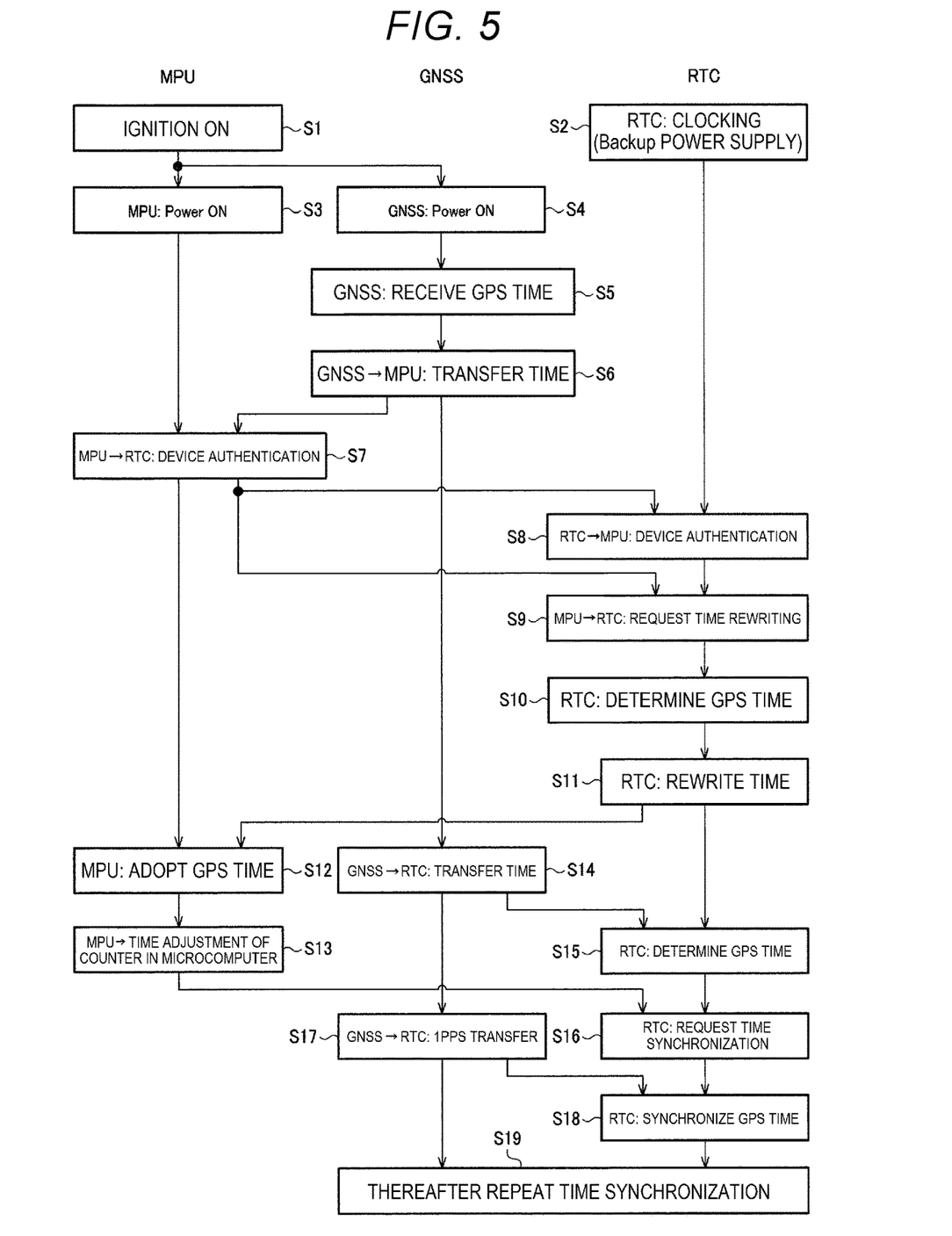
FIG. 5 is a flowchart showing a procedure of time rewriting processing in a system including the real-time clock device.

FIG. 5 is a flowchart showing a procedure of time rewriting processing in the system including the real-time clock device 100. In FIG. 5, time rewriting processing in the system including the MPU 600, the real-time clock device 100, and the GNSS 750 shown in FIG. 1 is explained as an example. In FIG. 5, "RTC" means the real-time clock device 100.

In step S1, the ignition is turned on. In step S2, the real-time clock device 100 continues the clocking irrespective of ON and OFF of the ignition. In steps S3 and S4, when the ignition is turned on, power supply to the MPU 600 and the GNSS 750 is turned on and the MPU 600 and the GNSS 750 start operation.

In step S5, the GNSS 750 receives time information from a GPS satellite together with position information. In step S6, the GNSS 750 transmits the time information to the MPU 600.

In steps S7 and S8, the MPU 600 and the real-time clock device 100 mutually perform device authentication. For example, the MPU 600 collates an ID number of the real-time clock device 100 and the real-time clock device 100 collates an ID number of the MPU 600 to mutually perform the device authentication. However, various methods can be adopted as a method of device authentication. The method is not limited to the ID number collation.

In step S9, the MPU 600 transmits a time rewriting request to the real-time clock device 100 together with time rewriting data. The time rewriting data is the time information received from the GNSS 750 by the MPU 600 in step S6.

In step S10, the real-time clock device 100 determines whether the time rewriting data received from the MPU 600 is legitimate. A determination method is as explained above. In step S11, when determining that the time rewriting data is legitimate, the real-time clock device 100 rewrite the present time data of the clocking circuit 120 with the time rewriting data.

In step S12, when the real-time clock device 100 determines that the time rewriting data is legitimate, the MPU 600 adopts the time information of the GPS as time information of the system. In step S13, the MPU 600 writes the time information of the GPS in a clocking counter inside the MPU 600 to perform time adjustment inside the MPU 600.

In step S14, the GNSS 750 transmits the time information received from the GPS satellite to the real-time clock device 100. In step S15, the real-time clock device 100 determines whether the time rewriting data, which is the time information received from the GNSS 750, is legitimate. In step S16, the MPU 600 transmits a time synchronization request to the real-time clock device 100. When determining in step S15 that the time rewriting data is legitimate, the real-time clock device 100 accepts the time synchronization request.

In step S17, the GNSS 750 transmits a 1 PPS signal (PPS: Pulse Per Second) to the real-time clock device 100. The 1 PPS signal is a time pulse signal generated by the GNSS 750 based on a GPS satellite signal. In step S18, the real-time clock device 100 performs time synchronization based on the 1 PPS signal. That is, the clocking circuit 120 rewrites, based on the 1 PPS signal, the present time data with time rewriting data including sub-second to synchronize the present time data of the clocking circuit 120 with the time information of the GPS.

In step S19, the GNSS 750 and the real-time clock device 100 repeat the time synchronization. That is, the GNSS 750 and the real-time clock device 100 repeat the processing in steps S14 to S18.

5. Second Configuration Example

Figure 6:
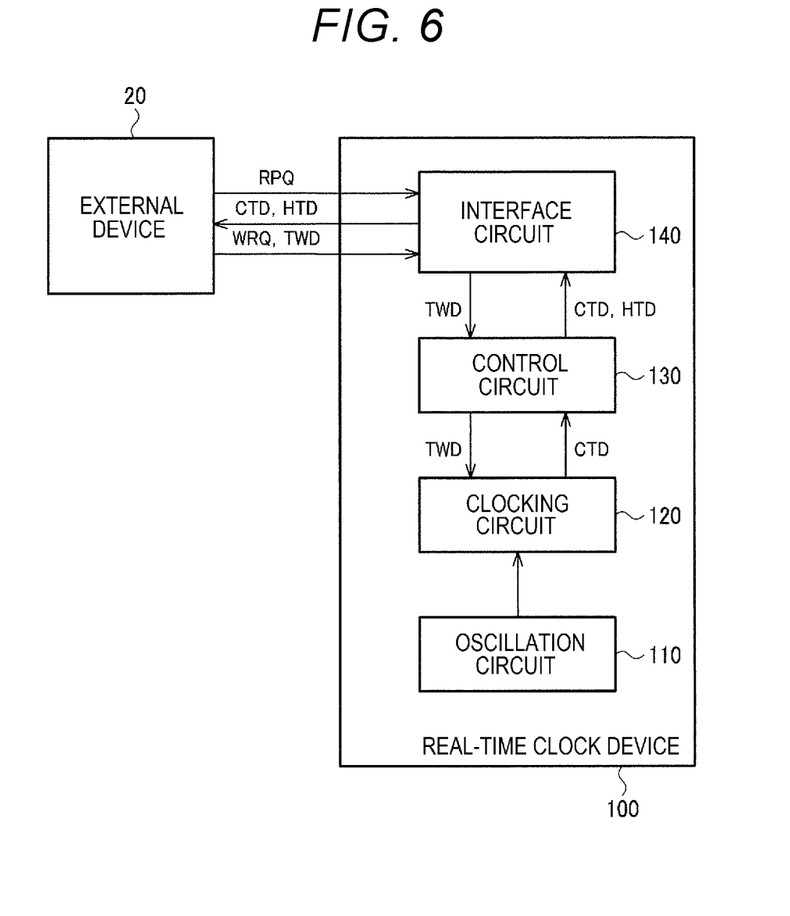
FIG. 6 is a second configuration example of the real-time clock device in the embodiment.

FIG. 6 is a second configuration example of the real-time clock device 100 in this embodiment. The real-time clock device 100 includes the interface circuit 140, the control circuit 130, the clocking circuit 120, and the oscillation circuit 110.

The oscillation circuit 110 generates an oscillation signal using a resonator. The clocking circuit 120 generates the present time data CTD based on the oscillation signal. When requested by the external device 20, the interface circuit 140 transmits data for determination HTD and the present time data CTD to the external device 20. The data for determination HTD is data for the external device 20 to determine whether the time rewriting data TWD used for rewriting of the present time data CTD is legitimate.

Specifically, the external device 20 transmits a readout request RPQ to the real-time clock device 100. When the interface circuit 140 receives the readout request RPQ, the control circuit 130 reads out the present time data CTD from the clocking circuit 120 and outputs the present time data CTD and the data for determination HTD to the interface circuit 140. The interface circuit 140 transmits the present time data CTD and the data for determination HTD to the external device 20.

The data for determination HTD is data for calculating an allowable error. That is, the control circuit 130 outputs reference time data and clocking accuracy data as the data for determination HTD. In this case, the external device 20 calculates an allowable error according to the above Expression (1) from the present time data CTD received from the real-time clock device 100 and the reference time data and the clocking accuracy data. The external device 20 performs comparison processing of the time rewriting data TWD and the present time data CTD based on the allowable error to determine whether the time rewriting data TWD is legitimate. Specifically, the external device 20 performs the determination according to the above Expressions (3) and (4).

Alternatively, the data for determination HTD may be data of the allowable error itself. That is, the control circuit 130 calculates an allowable error according to the above Expression (1) from the present time data CTD and the reference time data and the clocking accuracy data and outputs data of the allowable error as the data for determination HTD. In this case, the external device 20 performs comparison processing of the time rewriting data TWD and the present time data CTD based on the allowable error received from the real-time clock device 100 to determine whether the time rewriting data TWD is legitimate. Specifically, the external device 20 performs the determination according to the above Expressions (3) and (4).

When determining that the time rewriting data TWD is legitimate, the external device 20 transmits the time rewriting request WRQ and the time rewriting data TWD to the real-time clock device 100. When the interface circuit 140 receives the time rewriting request WRQ, the control circuit 130 rewrites the present time data CTD of the clocking circuit 120 with the time rewriting data TWD received by the interface circuit 140. When determining that the time rewriting data TWD is illegitimate, the external device 20 does not transmit the time rewriting request WRQ to the real-time clock device 100. That is, the present time data CTD of the real-time clock device 100 is not rewritten.

According to this embodiment, since the present time data CTD and the data for determination HTD are transmitted to the external device 20, the external device 20 can perform the comparison processing of the time rewriting data TWD and the present time data CTD based on the data for determination HTD. The external device 20 can determine legitimacy of the time rewriting data TWD based on a result of the comparison processing. Since legitimacy is determined based on time data indicating the present time, legitimacy of the time rewriting data TWD can be accurately determined. Consequently, for example, in the system shown in FIG. 1, the gateway 740 can broadcast legitimate time data to the vehicle-mounted network.

According to this embodiment, the hardware configuration and the sequence described in Patent Literature 1 are unnecessary. That is, according to this embodiment, since the real-time clock device 100 provided separately from the MPU performs clocking, a hardware configuration and a sequence for emergently retracting timestamp data to the nonvolatile memory at sudden power-off time are unnecessary.

6. Second Detailed Configuration Example

Figure 7:
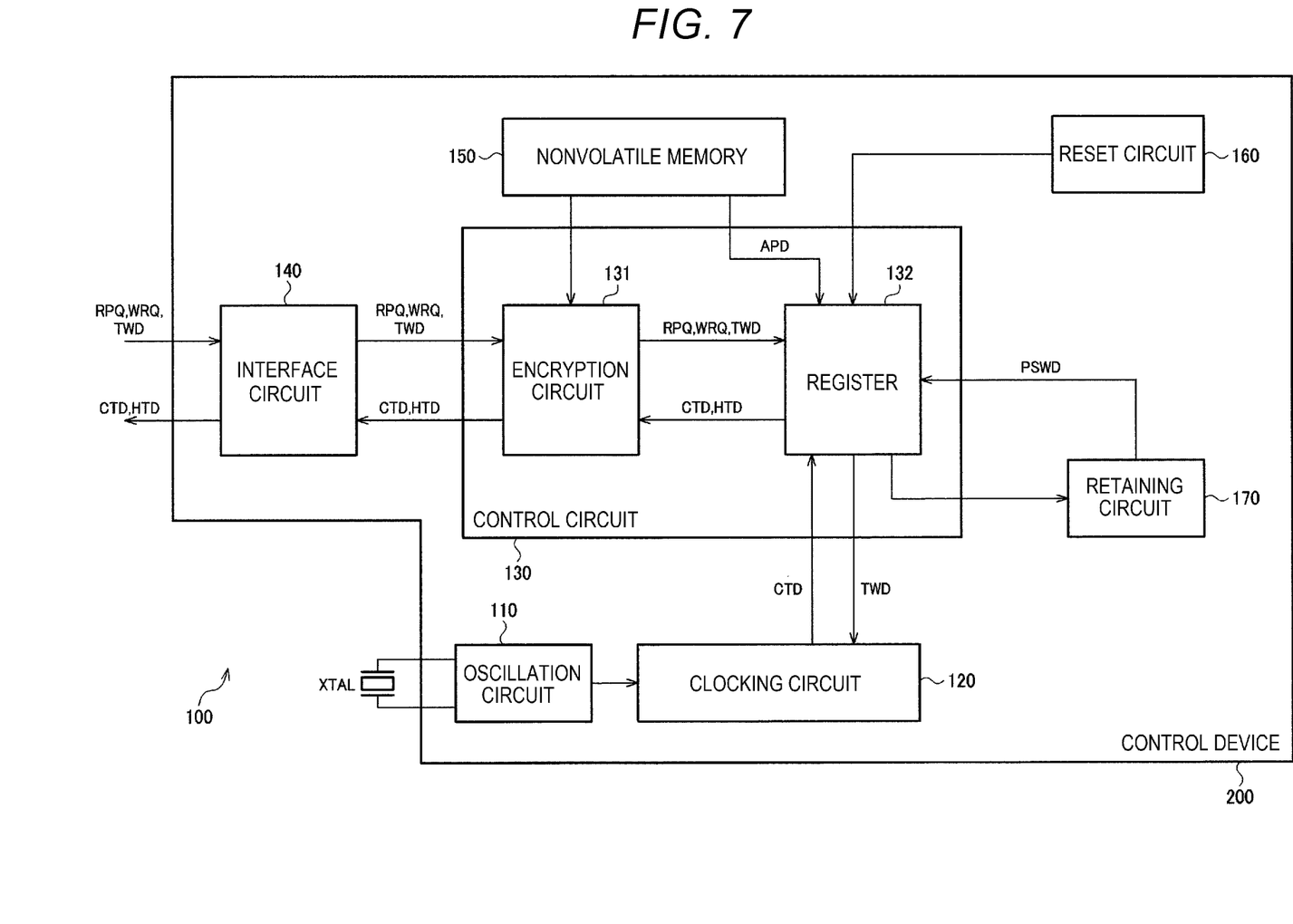
FIG. 7 is a second detailed configuration example of the real-time clock device.

FIG. 7 is a second detailed configuration example of the real-time clock device 100. In FIG. 7, the control circuit 130 includes the encryption circuit 131 and the register 132. The determination circuit 133 and the gate circuit 134 are not provided. The same components as the components explained above are denoted by the same reference numerals and signs. Explanation about the components is omitted as appropriate.

The interface circuit 140 receives an encrypted readout request RPQ from the external device 20. The encryption circuit 131 performs decryption processing of the encrypted readout request RPQ. The register 132 stores the readout request RPQ subjected to the decryption processing.

When the readout request RPQ is written in the register 132, the control circuit 130 outputs the present time data CTD and the data for determination HTD from the register 132 to the encryption circuit 131. For example, the control circuit 130 reads out the clocking accuracy data APD from the nonvolatile memory 150 to the register 132 and reads out the reference time data PSWD from the retaining circuit 170 to the register 132. The control circuit 130 outputs, as the data for determination HTD, the clocking accuracy data APD and the reference time data PSWD read out to the register 132. Alternatively, the control circuit 130 reads out the clocking accuracy data APD from the nonvolatile memory 150, reads out the reference time data PSWD from the retaining circuit 170, calculates an allowable error based on those data, and causes the register 132 to store data of the allowable error. The control circuit 130 outputs the data of the allowable error stored in the register 132 to the encryption circuit 131 as the data for determination HTD.

The encryption circuit 131 performs encryption processing of the present time data CTD and the data for determination HTD output from the register 132. The interface circuit 140 transmits the present time data CTD and the data for determination HTD subjected to the encryption processing to the external device 20.

When determining based on the present time data CTD and the data for determination HTD received from the real-time clock device 100 that the time rewriting data TWD is legitimate, the external device 20 encrypts the time rewriting request WRQ and the time rewriting data TWD and transmits the encrypted time rewriting request WRQ and the encrypted time rewriting data TWD to the real-time clock device 100.

The interface circuit 140 receives the encrypted time rewriting request WRQ and the encrypted time rewriting data TWD. The encryption circuit 131 performs decryption processing of the encrypted time rewriting request WRQ and the encrypted time rewriting data TWD. The register 132 stores the time rewriting request WRQ and the time rewriting data TWD subjected to the decryption processing. When the time rewriting request WRQ is written in the register 132, the control circuit 130 outputs a writing signal and the time rewriting data TWD written in the register 132 to the clocking circuit 120. The clocking circuit 120 rewires, based on the writing signal, the present time data CTD with the time rewriting data TWD.

7. An Electronic Device and a Vehicle

Figure 8:
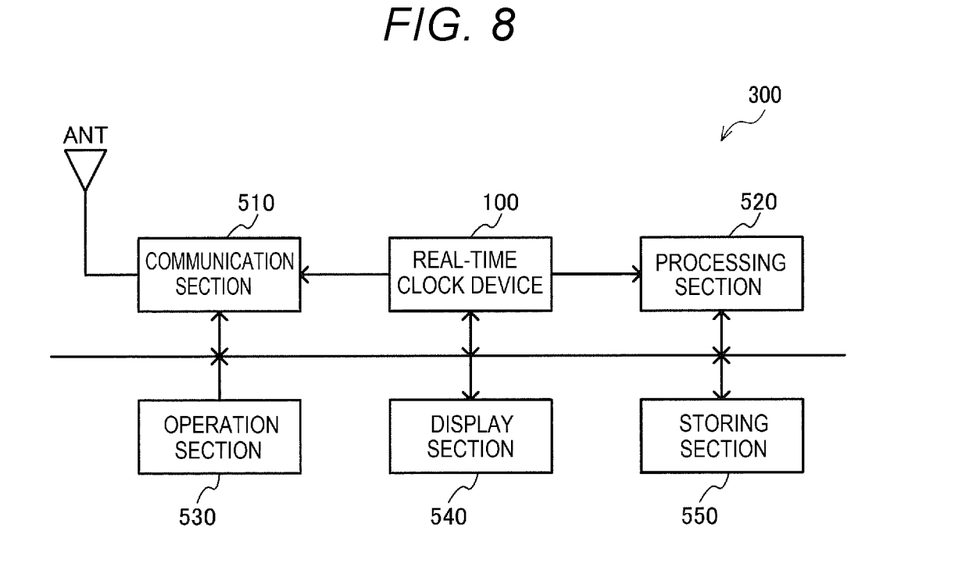
FIG. 8 is a configuration example of an electronic device.

FIG. 8 is a configuration example of an electronic device 300 including the real-time clock device 100 in this embodiment. The electronic device 300 includes the real-time clock device 100, an antenna ANT, a communication section 510, and a processing section 520. The electronic device 300 can include an operation section 530, a display section 540, and a storing section 550. The communication section 510 is a communication circuit or a communication device. The processing section 520 is a processing circuit or a processing device. The operation section 530 is an operation device. The display section 540 is a display device. The storing section 550 is a storage device. The electronic device 300 is not limited to the configuration shown in FIG. 8. Various modified implementations for omitting a part of the component and adding other components are possible.

As the electronic device 300, for example, a vehicle-mounted electronic device, a video device, or a printing device can be assumed. The vehicle-mounted electronic device is an ECU (Electronic Control Unit), a meter panel, or the like. The video device is a digital camera, a video camera, or the like. The printing device is a printer, a printer multifunction peripheral, or the like. Alternatively, as the electronic device 300, various devices such as a GPS incorporated watch or a wearable device, a smartphone, a cellular phone, a portable game machine, a portable information terminal, a content providing terminal, and a network related device can be assumed. The wearable device is a biological information measuring device, a head-mounted display device, or the like. The portable information terminal is a notebook PC or a tablet PC, a smartphone, or the like. The network-related device is a base station, a router, or the like.

The communication section 510 performs processing for receiving data from the outside via the antenna ANT and processing for transmitting data to the outside via the antenna ANT. The processing section 520 acquires present time data from the real-time clock device 100 and performs various kinds of processing based on the present time data. For example, the processing section 520 performs control processing of the electronic device 300, various kinds of digital processing of data transmitted and received via the communication section 510, or the like. The functions of the processing section 520 can be realized by a processor such as a microcomputer. The operation section 530 is used by a user to perform input operation and can be realized by an operation button, a touch panel display, or the like. The display section 540 displays various kinds of information and can be realized by a liquid crystal display, an organic EL display, or the like. The storing section 550 stores data and is, for example, a semiconductor memory such as a RAM or a ROM or a hard disk drive.

Figure 9:
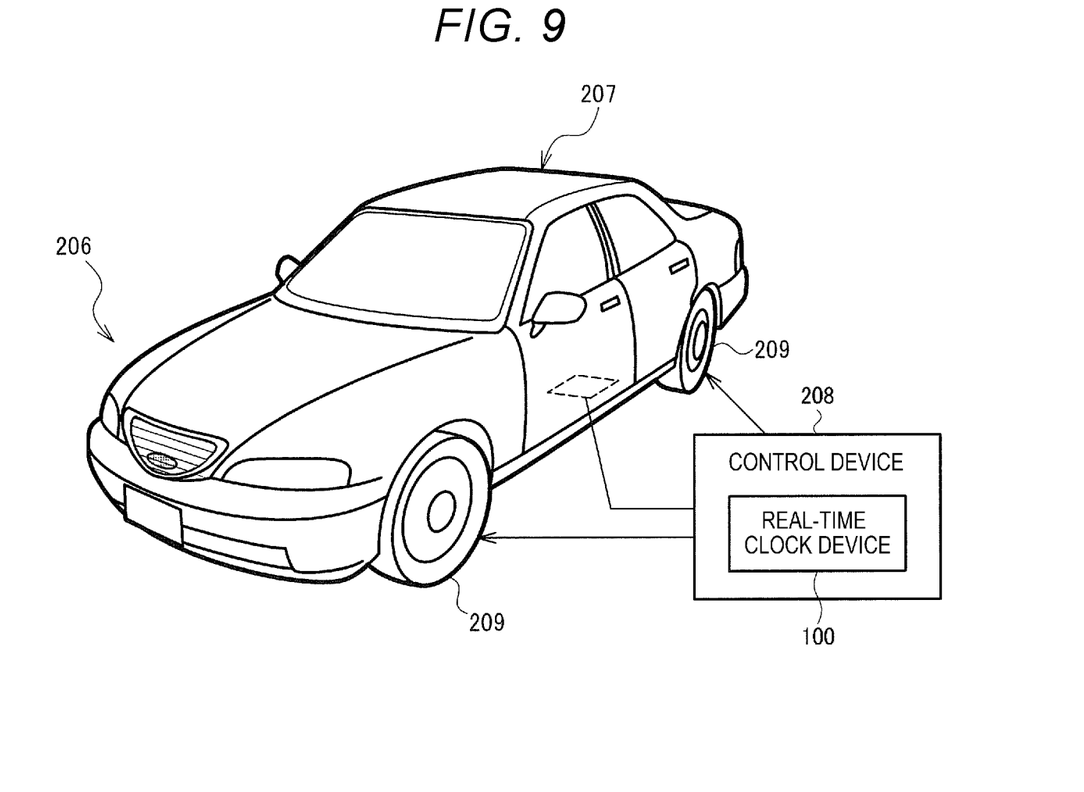
FIG. 9 is an example of a vehicle.

FIG. 9 is an example of a vehicle including the real-time clock device 100 in this embodiment. The real-time clock device 100 can be incorporated in various vehicles such as a car, an airplane, a motorbike, a bicycle, a robot, and a ship. The vehicle is, for example, an apparatus or a device including a driving mechanism such as an engine or a motor, a steering mechanism such as a handle or a rudder, and various electronic devices and moving on the ground, in the sky, or in the sea. FIG. 9 schematically shows an automobile 206 as a specific example of the vehicle. The real-time clock device 100 is incorporated in the automobile 206. A control device 208 performs various kinds of control processing based on present time data generated by the real-time clock device 100. For example, the control device 208 controls hardness of a suspension according to a posture of a vehicle body 207 or controls brakes of respective wheels 209. A device in which the real-time clock device 100 is incorporated is not limited to such a control device 208. The real-time clock device 100 can be incorporated in various devices provided in vehicles such as the automobile 206 and a robot.

As explained above, a real-time clock device in this embodiment may include: an oscillation circuit configured to generate an oscillation signal using a resonator; a clocking circuit configured to generate present time data based on the oscillation signal; an interface circuit configured to receive a time rewriting request and time rewriting data for the present time data from an external device; and a control circuit. The control circuit performs comparison processing of the present time data of the clocking circuit and the time rewriting data to determine whether the time rewriting data is legitimate.

According to this embodiment, when the present time data is rewritten by time rewriting data acquired from the outside, it is possible to accurately verify legitimacy of the time rewriting data. That is, according to this embodiment, the comparison processing of the present time data and the time rewriting data is performed to determine whether the time rewriting data is legitimate. That is, it is possible to accurately determine legitimacy of the time rewriting data because the determination is based on time data indicating present time rather than based on time data indicating time in the past.

In this embodiment, the control circuit may execute the time rewriting request when determining that the time rewriting data is legitimate.

In this way, when it is determined that the time rewriting data from the external device is illegitimate, the present time data of the clocking circuit is not rewritten by the time rewriting data. Consequently, it is possible to prevent the present time data of the real-time clock device from being rewritten by illegitimate time rewriting data.

In this embodiment, the real-time clock device may include: a memory configured to store clocking accuracy data of the clocking circuit; and a retaining circuit configured to retain reference time data serving as an indicator of time when the present time data is rewritten last time. The control circuit may perform the comparison processing using the reference time data, the clocking accuracy data, and the present time data to determine whether the time rewriting data is legitimate.

In this way, it is possible to learn, based on the reference time data and the present time data, an elapsed time from when the present time data is rewritten last time until the present. It is possible to estimate accuracy of the present time data based on the elapsed time and the clocking accuracy data. Consequently, it is possible to perform comparison processing concerning whether the present time data and the time rewriting data are within an accuracy range. It is possible to accurately determine legitimacy of the time rewriting data.

In this embodiment, the control circuit may calculate an allowable error based on a difference between the present time data and the reference time data and the clocking accuracy data and determine based on the allowable error whether the time rewriting data is legitimate.

In this way, the difference between the present time data and the reference time data is equivalent to the elapsed time from when the present time data is rewritten last time until the present. The allowable error is calculated based on the difference and the clocking accuracy data to estimate the accuracy of the present time data. It is determined based on the allowable error whether the time rewriting data is legitimate. Therefore, it is possible to reduce likelihood that it is erroneously determined that the time rewriting data is illegitimate because of an error, although the time rewriting data is legitimate.

In this embodiment, the control circuit may determine that the time rewriting data is legitimate when the difference between the present time data and the time rewriting data is smaller than the allowable error.

As explained above, the allowable error corresponds to the accuracy of the present time data. When the difference between the present time data and the time rewriting data is smaller than the allowable error, it can be determined that the time rewriting data is within an accuracy range of the present time data. According to this embodiment, when it can be determined that the present time data is within the accuracy range, it is possible to determine that the time rewriting data is legitimate.

In this embodiment, the clocking accuracy data may be data representing oscillation frequency accuracy of the resonator.

The clocking circuit generates the present time data based on the oscillation signal generated using the resonator. That is, frequency accuracy of the oscillation signal relates to the accuracy of the present time data. Therefore, by using data representing the oscillation frequency accuracy of the resonator as the clocking accuracy data, it is possible to calculate an allowable error corresponding to the accuracy of the present time data.

In this embodiment, the interface circuit may receive, from the external device, the time rewriting data that is encrypted. The control circuit may decrypt the encrypted time rewriting data.

In this way, since the time rewriting data received by the real-time clock device from the external device is encrypted data, security against rewriting of the present time data is improved. That is, it is possible to reduce, through encryption, likelihood that illegitimate time rewriting data is input to the real-time clock device.

In this embodiment, the control circuit may output the encrypted present time data to the external device via the interface circuit when receiving a readout request for the present time data from the external device.

In this way, since the time clock data transmitted to the external device by the real-time clock device is encrypted data, security at the time when the external device acquires the present time data is improved. That is, it is possible to reduce, through encryption, likelihood that the external device acquires illegitimate present time data.

As explained above, a real-time clock device in this embodiment may include: an oscillation circuit configured to generate an oscillation signal using a resonator; a clocking circuit configured to generate present time data based on the oscillation signal; and an interface circuit. The interface circuit may transmit, when receiving a request from an external device, to the external device, data for determination for the external device to determine whether time rewriting data used for rewriting of the present time data is legitimate and the present time data.

According to this embodiment, when the present time data is rewritten by time rewriting data acquired from the outside, it is possible to accurately verify legitimacy of the time rewriting data. That is, according to this embodiment, since the present time data and the data for determination are transmitted to the external device, the external device can perform comparison processing of the time rewriting data and the present time data based on the data for determination. The external device can determine legitimacy of the time rewriting data based on a result of the comparison processing. Since the legitimacy is determined based on time data indicating present time, it is possible to accurately determine legitimacy of the time rewriting data.

In this embodiment, the real-time clock device may include a control circuit. When the interface circuit receives a time rewriting request from the external device that determines that the time rewriting data is legitimate, the control circuit may rewrite the present time data with the time rewriting data.

In this way, when the external device determines that the time rewriting data is illegitimate, the present time data of the real-time clock device is not rewritten by the time rewriting data. Consequently, it is possible to prevent the present time data of the real-time clock device from being rewritten by illegitimate time rewriting data.

In this embodiment, the real-time clock device may include a retaining circuit configured to retain reference time data serving as an indicator of time when the present time data is rewritten last time. The control circuit may transmit the reference time data to the external device as the data for determination via the interface circuit.

In this way, the external device can learn, based on the reference time data and the present time data, an elapsed time from when the present time data is rewritten last time until the present. The external device can estimate accuracy of the present time data based on the elapsed time. Consequently, the external device can perform comparison processing concerning whether the present time data and the time rewriting data are within an accuracy range. The external device can accurately determine legitimacy of the time rewriting data.

In this embodiment, the real-time clock device may include a memory configured to store clocking accuracy data of the clocking circuit. The control circuit may transmit the reference time data and the clocking accuracy data to the external device as the data for determination via the interface circuit.

In this way, the external device can estimate accuracy of the present time data based on the elapsed time and the clocking accuracy data. Consequently, it is possible to perform comparison processing concerning whether the present time data and the time rewriting data are within an accuracy range. It is possible to accurately determine legitimacy of the time rewriting data.

In this embodiment, the real-time clock device may include a memory configured to store clocking accuracy data of the clocking circuit. The control circuit may calculate an allowable error based on a difference between the present time data and the reference time data and the clocking accuracy data. The interface circuit may transmit the reference time data and the allowable error to the external device as the data for determination.

In this way, the difference between the present time data and the reference time data is equivalent to the elapsed time from when the present time data is rewritten last time until the present. The allowable error is calculated based on the difference and the clocking accuracy data to estimate the accuracy of the present time data. The external device can accurately determine legitimacy of the time rewriting data by determining based on the allowable error whether the time rewriting data is legitimate.

In this embodiment, the real-time clock device may include a power supply terminal. Second electric power may be supplied to the power supply terminal when first electric power supplied to the external device is off.

In this way, even when the external device is shut down because the first electric power is off, the real-time clock device can perform a clocking operation because the second electric power is supplied. That is, when the external device starts because the first electric power is supplied to the external device again, the real-time clock device continues to generate the present time data according to clocking. Consequently, when the external device transmits the time rewriting request and the time rewriting data to the real-time clock device after the start, the real-time clock device is capable of performing comparison of the present time data and the time rewriting data.

In this embodiment, the real-time clock device may include a resonator electrically coupled to the oscillation circuit.

An electronic device in this embodiment includes the real-time clock device explained above.

A vehicle in this embodiment includes the real-time clock device explained above.

The embodiment is explained in detail above. However, those skilled in the art could easily understood that many modifications not substantively departing from the new matters and the effects the present disclosure are possible. Therefore, all such modifications are assumed to be included in the scope of the present disclosure. For example, a term used together with a broader or synonymous different term at least once in the specification or the drawings can be replaced with the different term in any parts of the specification or the drawings. All combinations of the embodiment and the modifications are also included in the scope of the present disclosure. The configurations, the operations, and the like of the circuit device, the real-time clock device, the electronic device, the vehicle, and the like are not limited to the configurations, the operations, and the like explained in the embodiment. Various modified implementations of the configurations, the operations, and the like are possible.

What is claimed is:

1. A real-time clock device comprising:
   an oscillation circuit configured to generate an oscillation signal using a resonator;
   a clocking circuit configured to generate present time data based on the oscillation signal;
   an interface circuit configured to receive a time rewriting request and time rewriting data for the present time data from an external device; and
   a control circuit configured to perform comparison processing of the present time data of the clocking circuit and the time rewriting data to determine whether the time rewriting data is legitimate.

2. The real-time clock device according to claim 1, wherein the control circuit executes the time rewriting request when determining that the time rewriting data is legitimate.

3. The real-time clock device according to claim 1, further comprising:
   a memory configured to store clocking accuracy data of the clocking circuit; and
   a retaining circuit configured to retain reference time data serving as an indicator of time when the present time data is rewritten last time, wherein
   the control circuit performs the comparison processing using the reference time data, the clocking accuracy data, and the present time data to determine whether the time rewriting data is legitimate.

4. The real-time clock device according to claim 3, wherein the control circuit calculates an allowable error based on a difference between the present time data and the reference time data and the clocking accuracy data, and determines, based on the allowable error, whether the time rewriting data is legitimate.

5. The real-time clock device according to claim 4, wherein the control circuit determines that the time rewriting data is legitimate when the difference between the present time data and the time rewriting data is smaller than the allowable error.

6. The real-time clock device according to claim 3, wherein the clocking accuracy data is data representing oscillation frequency accuracy of the resonator.

7. The real-time clock device according to claim 1, wherein
   the interface circuit receives, from the external device, the time rewriting data that is encrypted, and
   the control circuit decrypts the encrypted time rewriting data.

8. The real-time clock device according to claim 7, wherein the control circuit outputs the encrypted present time data to the external device via the interface circuit when receiving a readout request for the present time data from the external device.

9. The real-time clock device according to claim 1, further comprising a power supply terminal to which second electric power is supplied when first electric power supplied to the external device is off.

10. The real-time clock device according to claim 1, further comprising the resonator.

11. An electronic device comprising the real-time clock device according to claim 1.

12. A vehicle comprising the real-time clock device according to claim 1.

13. A real-time clock device comprising:
- an oscillation circuit configured to generate an oscillation signal using a resonator;
- a clocking circuit configured to generate present time data based on the oscillation signal; and
- an interface circuit configured to transmit, when receiving a request from an external device, to the external device, data for determination for the external device to determine whether time rewriting data used for rewriting of the present time data is legitimate and the present time data.

14. The real-time clock device according to claim 13, further comprising a control circuit configured to, when the interface circuit receives a time rewriting request from the external device that determines that the time rewriting data is legitimate, rewrite the present time data with the time rewriting data.

15. The real-time clock device according to claim 14, further comprising a retaining circuit configured to retain reference time data serving as an indicator of time when the present time data is rewritten last time, wherein
the control circuit transmits the reference time data to the external device as the data for determination via the interface circuit.

16. The real-time clock device according to claim 15, further comprising a memory configured to store clocking accuracy data of the clocking circuit, wherein
the control circuit transmits the reference time data and the clocking accuracy data to the external device as the data for determination via the interface circuit.

17. The real-time clock device according to claim 15, further comprising a memory configured to store clocking accuracy data of the clocking circuit, wherein
the control circuit calculates an allowable error based on a difference between the present time data and the reference time data and the clocking accuracy data, and
the interface circuit transmits the reference time data and the allowable error to the external device as the data for determination.

* * * * *